United States Patent
Kuno et al.

(10) Patent No.: US 6,436,331 B1
(45) Date of Patent: Aug. 20, 2002

(54) METHOD OF RESIN SEALING A GAP BETWEEN A SEMICONDUCTOR CHIP AND A SUBSTRATE

(75) Inventors: Takaki Kuno; Hirotaka Okamoto, both of Kyoto; Shoji Yamamoto; Teikou Odashima, both of Kawasaki, all of (JP)

(73) Assignees: Towa Corporation, Kyoto; Kabushiki Kaisha Toshiba, Kawasaki, both of (JP)

( * ) Notice: Subject to any disclaimer, the term of this patent is extended or adjusted under 35 U.S.C. 154(b) by 0 days.

(21) Appl. No.: 09/599,101

(22) Filed: Jun. 8, 2000

(30) Foreign Application Priority Data

Jun. 8, 1999 (JP) .............................................. 11-161315

(51) Int. Cl.[7] ...................... B29C 45/14; B29C 65/70; B29C 70/74
(52) U.S. Cl. .................. 264/510; 264/102; 264/272.15; 264/272.17
(58) Field of Search ................................ 264/510, 102, 264/105, 272.15, 272.17; 29/827, 840, 841; 438/116, 125, 112, 126; 425/110, 116, 375, 546

(56) References Cited

U.S. PATENT DOCUMENTS

| | | | | |
|---|---|---|---|---|
| 5,290,197 A | * | 3/1994 | Ohnuma et al. | ....... 264/272.17 |
| 5,710,071 A | * | 1/1998 | Beddingfield et al. | ...... 438/108 |
| 6,000,924 A | * | 12/1999 | Wang et al. | ................. 425/125 |
| 6,027,590 A | * | 2/2000 | Sylvester et al. | ...... 264/272.17 |
| 6,081,997 A | * | 7/2000 | Chia et al. | ..................... 29/841 |
| 6,126,428 A | * | 10/2000 | Mitchell et al. | ............. 425/110 |
| 6,225,144 B1 | * | 5/2001 | How et al. | ................... 438/106 |

FOREIGN PATENT DOCUMENTS

JP           09 260432         10/1997

* cited by examiner

*Primary Examiner*—Angela Ortiz
(74) *Attorney, Agent, or Firm*—W. F. Fasse; W. G. Fasse

(57) ABSTRACT

A resin sealing method for sealing a gap between a substrate and a semiconductor chip mounted thereon includes the following steps: applying a predetermined amount of resin at and along the circumference of the semiconductor chip in such a manner so as to maintain a space between the resin and a side face of the semiconductor chip; reducing the pressure of the atmosphere around the substrate to exhaust air from the gap; reducing the viscosity of the applied resin to partially fill the gap with resin, thereby leaving a closed cavity reduced in pressure; pressurizing the atmosphere around the substrate to compress the closed cavity due to the pressure difference from the surrounding atmosphere to entirely fill the gap with resin. The exhausting of the air is very stable, and a concentration of resin at the corner of the semiconductor chip can be suppressed, thereby avoiding the spattering of resin onto the top of the chip.

15 Claims, 7 Drawing Sheets

METHOD OF RESIN SEALING A GAP BETWEEN A SEMICONDUCTOR CHIP AND A SUBSTRATE

BACKGROUND OF THE INVENTION

1. Field of the Invention

The present invention relates to a resin sealing method and apparatus of effecting resin sealing after the pad of a semiconductor chip mounted on a substrate is joined to the electrode of the substrate through a bump. Particularly, the present invention relates to a resin sealing method and apparatus filling the gap between a semiconductor chip and a substrate with resin.

2. Description of the Background Art

In a semiconductor device having the pad of the semiconductor chip and the electrode of the substrate electrically connected via a bump, resin is inserted or filled into the gap between the semiconductor chip and the substrate and is then cured. This resin sealing is carried out in order to prevent generation of cracks at the junction due to thermal stress, and intrusion of a substance that adversely affects the semiconductor chip such as intrusion of impurities and moisture.

Conventionally, the method shown in FIGS. 5A–5D is employed in order to insert and cure resin in the gap between a semiconductor chip and a substrate. FIGS. 5A–5D are plan views of a semiconductor device corresponding to respective steps of a conventional resin sealing method.

Referring to FIG. 5A, liquid resin 102 is applied around a semiconductor chip 101 mounted on a substrate 100 so as to substantially surround the circumference thereof. A portion of the circumference of semiconductor chip 101 that is to serve as an outlet 103 is left absent of liquid resin 102.

Referring to FIG. 5B, the atmosphere around substrate 100 is reduced in pressure. Accordingly, the air present between substrate 100 and semiconductor chip 101 is output from outlet 103 as exhaust 104.

Referring to FIG. 5C, the viscosity of the applied liquid resin 102 is reduced by applying heat under the state where the atmosphere around substrate 100 is reduced in pressure. As a result, liquid resin 102 reduced in viscosity flows into the gap between substrate 100 and semiconductor chip 100 by the capillary action to be connected at the portion absent of the resin to become annular. Thus, the gap between substrate 100 and semiconductor chip 101 is filled with liquid resin 102 leaving a closed cavity 105 that is reduced in pressure.

Referring to FIG. 5D, the atmosphere around substrate. 100 is pressurized up to the atmospheric pressure. Under atmospheric pressure, closed cavity 105 in the gap between substrate 100 and semiconductor chip 101 is compressed by the pressure difference from the surrounding space to be eliminated. In other words, the entire region of the gap between substrate 100 and semiconductor chip 100 is filled with liquid resin 102. Then, heating is applied to cure liquid resin 102. By the foregoing steps, cured seal resin is formed at the gap between substrate 100 and semiconductor chip 100, and also at the circumference of semiconductor chip 101.

The conventional resin sealing method poses the following problems shown in FIGS. 6A–6D. FIGS. 6A–6D are plan views of a semiconductor device corresponding to respective steps of a conventional resin sealing method representing the problems. Referring to FIG. 6A, liquid resin 102 is applied on substrate 100, likewise FIG. 5A. In reducing the pressure of the atmosphere around substrate 100, there is the case where abnormal exhaust 106 penetrates through liquid resin 102 to be output from a region other than outlet 103 due to uneven application of liquid resin 102, as shown in FIG. 6B. Also, in pressurizing the atmosphere around substrate 100, there is the case where liquid resin 102 compressed towards closed cavity 105 by the pressure difference from the surrounding space is partially concentrated at the corner of semiconductor chip 101 to rise over the top surface of semiconductor chip 101. There is also the case where abnormal exhaust 106 is output from substantially the entire circumference of semiconductor chip 101 when the area of the cross section of outlet 103 is not large enough.

In the foregoing cases, a portion of liquid resin 102 will be blown off by the abnormal exhaust 106 to adhere on the top surface of semiconductor chip 101 as shown in FIG. 6C. The adhered liquid resin 102 will remain on the top surface of semiconductor substrate 101 as resin covering 107. This resin covering 107 is cured by the heating process as shown in FIG. 6D to cause appearance defect in the completed semiconductor device to degrade the yield.

SUMMARY OF THE INVENTION

In view of the foregoing, an object of the present invention is to provide a resin sealing method and apparatus to improve the yield by preventing generation of a resin covering in filling the gap between a substrate and a semiconductor chip with resin.

According to an aspect of the present invention, a resin sealing method achieving the above object has resin inserted and cured in the gap formed between a substrate and a semiconductor chip mounted on the substrate. The resin sealing method includes the steps of applying resin of a predetermined amount, which is set corresponding to the circumferential configuration of the semiconductor chip, at or along the circumference of the semiconductor chip under a state retaining a predetermined void or space between the resin and a side face of the semiconductor chip, reducing the pressure of the atmosphere around the substrate to exhaust air from the gap, reducing the viscosity of the applied resin to partially fill the gap with resin and thereby leaving a closed cavity reduced in pressure, and pressurizing the atmosphere around the substrate to compress the closed cavity from the surrounding atmosphere due to the pressure difference therebetween to entirely fill the gap with resin.

According to this resin sealing method, resin of a predetermined amount is applied at or along the circumference of the semiconductor chip in such a manner so as to retain a void or space between the resin and the side face of the semiconductor chip. Accordingly, a region absent of resin is formed surrounding the semiconductor chip at the substrate plane. By reducing the pressure of the atmosphere around the substrate, the air present between the substrate and the semiconductor chip is exhausted through the region where resin is not applied, i.e. through the gap or space formed between the resin applied at the circumferential position of the semiconductor chip and the side face of the semiconductor chip. Since this resin-free space forms a region where air can be exhausted having a large area of cross, section at the circumference of the semiconductor chip, exhaust can be effected stably.

At the corner of the semiconductor chip, the amount of resin to be applied is reduced or a region absent of applying resin is provided. As a result, exhaust can be effected in stability at the corner region where exhaust is concentrated so that the exhaust pressure is increased. Thus, there is the advantage superior in practical usage of providing a resin sealing method and apparatus that can prevent generation of a resin covering caused by abnormal exhaust and resin concentration.

In the above resin sealing method, the step of applying resin preferably has the amount of resin applied at the circumferential position of the site where the circumferential configuration of the semiconductor chip corresponds to a corner set lower than the amount of resin applied at the circumferential position of other sites of the semiconductor chip.

In a preferable embodiment of the resin sealing method of the present invention, the step of applying resin includes the step of applying resin of a predetermined amount at the circumferential position of the semiconductor chip excluding the site where the circumferential configuration of the semiconductor chip corresponds to a corner.

According to another aspect of the present invention, a resin sealing method of inserting and curing resin in a gap formed between a substrate and a semiconductor chip mounted on the substrate includes the steps of applying resin of a predetermined amount, which is set corresponding to the circumferential configuration of the semiconductor chip, at or along the circumference of the semiconductor chip in contact with a portion of the side face of the semiconductor chip at one region and retaining a predetermined void or space between the resin and another region of the side face, reducing the pressure of the atmosphere around the substrate to exhaust air from the gap, reducing the viscosity of the applied resin to partially fill the gap with resin and thereby leaving a closed cavity reduced in pressure, and pressurizing the atmosphere around the substrate to compress the closed cavity from the surrounding atmosphere due to the pressure difference therebetween to entirely fill the gap with resin.

In a preferable embodiment of the resin sealing method of the present invention, the step of exhausting includes the step of reducing the pressure of the atmosphere around the substrate from the atmospheric pressure down to a predetermined pressure over a predetermined period of time.

The resin sealing apparatus of the present invention fills a gap formed between a substrate and a semiconductor chip mounted on the substrate with resin. The resin sealing apparatus includes an application unit applying resin of a predetermined amount, which is set corresponding to the circumferential configuration of the semiconductor chip, at the circumference of the semiconductor chip in a manner retaining a predetermined void or space between the resin and the side face of the semiconductor chip, a pressure reduction unit to reduce the pressure of the atmosphere around the substrate to exhaust air from the gap, a viscosity reduction unit reducing the viscosity of the applied resin to partially fill the gap with resin leaving a closed cavity reduced in pressure, and a pressurization unit pressurizing the atmosphere around the substrate to compress the closed cavity from the surrounding atmosphere due to the pressure difference therebetween to entirely fill the gap with resin.

According to this resin sealing apparatus, resin of a predetermined amount is applied at the circumferential position of the semiconductor chip under a state retaining a void or space relative to the side face of the semiconductor chip. Accordingly, a region absent of resin is formed at the substrate plane, surrounding the circumference of the semiconductor chip. When the atmosphere around the substrate is reduced in pressure, the air present in the gap between the substrate and the semiconductor chip is exhausted through the region where resin is not applied, i.e. through the space formed between the resin applied at the circumferential position of the semiconductor chip and the side face of the semiconductor chip. Since the region from which air is exhausted is formed to have a large area of cross section at the circumference of the semiconductor chip, exhaust can be effected stably.

In a preferable embodiment of the resin sealing apparatus of the present invention, the atmosphere around the substrate is reduced in pressure from the atmospheric pressure down to a predetermined pressure over a predetermined period of time by the pressure reduction unit of the resin sealing apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

Figure 1:
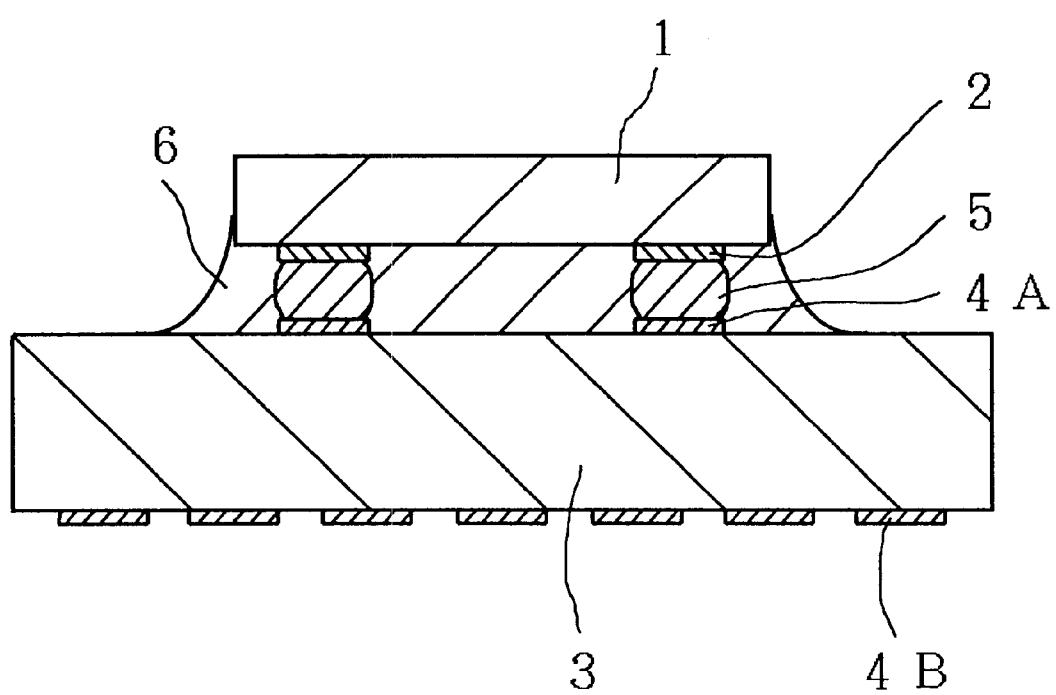
FIG. 1 is a sectional view of a semiconductor device fabricated according to a resin sealing method and resin sealing apparatus of the present invention.

The semiconductor device of FIG. 1 includes a semiconductor chip 1 where semiconductor elements are formed, a pad 2 which is an electrode of semiconductor chip 1, a substrate 3 formed of, for example ceramic or organic material, an electrode 4A for connection with substrate 3, an external electrode 4B of substrate 3, a bump 5 formed of solder, for example, and resin 6 covering at least a portion of the side face of semiconductor chip 1 and filled in the gap between semiconductor chip 1 and substrate 3.

As shown in FIG. 1, pad 2 of semiconductor chip 1 and electrode 4A of substrate 3 are electrically connected by bump 5. A gap of 20–200 $\mu$m, for example, is formed between semiconductor chip 1 and substrate 3. This gap is filled with resin 6 such as epoxy resin which is then cured. This resin 6 covers pad 2, connection electrode 4A and bump 5 to prevent exposure thereof, and allows semiconductor chip 1 and substrate 3 to be fixed so as to absorb any difference in thermal stress therebetween.

An embodiment of the resin sealing method of the present invention will be described with reference to FIGS. 2A–2D.

Respective steps carried out in fabricating the semiconductor device of FIG. 1 before the resin sealing method of the present invention is employed will be first described. Bump 5 formed of solder, for example, is provided on pad 2 of semiconductor chip 1. Semiconductor chip 1 is turned over, and positioning of pad 2 and connection electrode 4A of substrate 3 is effected. Then, substrate 3 is mounted with semiconductor chip 1. Bump 5 is heated to melt, whereby pad 2 of semiconductor chip 1 is electrically connected to connection electrode 4A of substrate 3.

Figure 2A:
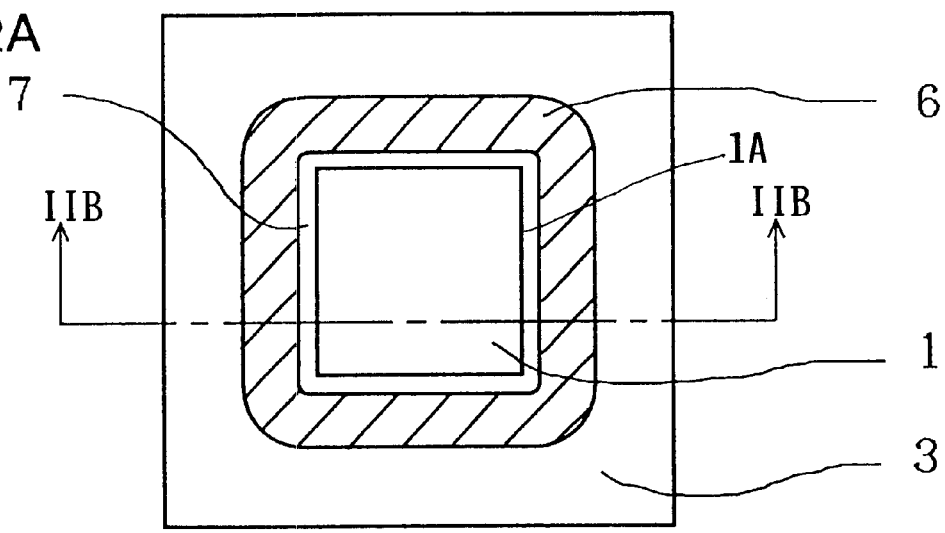
FIG. 2A is a plan view of a semiconductor device during a fabrication step employing the resin sealing method of the present invention.
Figure 2B:
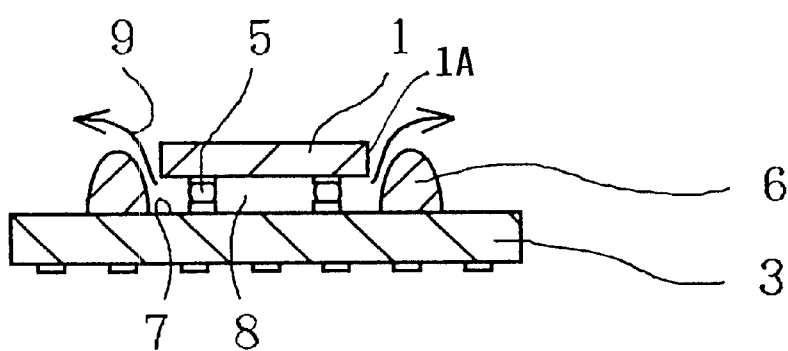
FIG. 2B is a sectional view taken along line $II_B$–$II_B$ of FIG. 2A.

According to the resin sealing method of the present invention, resin 6 is to be inserted or filled into the gap between semiconductor chip 1 and substrate 3 and is thereafter to be cured. As shown in FIGS. 2A and 2B, liquid resin 6 such as epoxy resin is applied to completely surround the circumference of semiconductor chip 1 with an exposed portion or predetermined space 7 above substrate 3, between the resin 6 and the side face 1A of the chip 1. In other words, resin 6 is applied at the circumferential position of semiconductor chip 1 with a predetermined void or space 7 relative to the side face of semiconductor chip 1.

Then, the atmosphere around substrate 3 is reduced in pressure. Accordingly, the air present in gap 8 between the semiconductor chip 1 and substrate 3 is discharged as exhaust 9 passing above exposed portion 7, i.e. out through the predetermined space surrounding semiconductor chip 1.

Figure 2C:
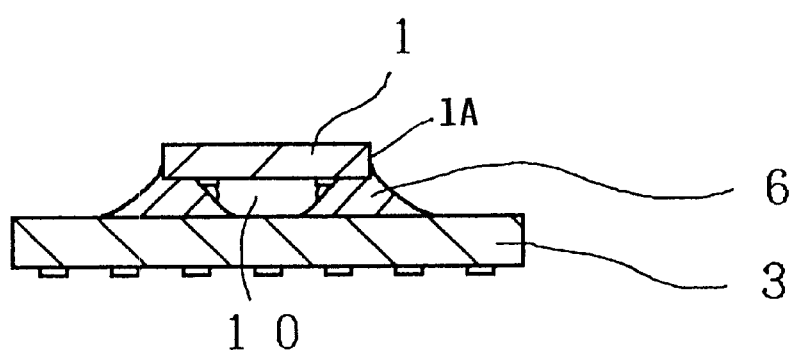
FIGS. 2C and 2D are sectional views of the semiconductor device at respective fabrication steps.

As shown in FIG. 2C, viscosity of the applied liquid resin 6 is reduced by applying heat, for example, under the state where the atmosphere around substrate 3 is reduced in pressure. Accordingly, resin 6 reduced in viscosity comes into contact with the side face and bottom face of semiconductor chip 1, and further intrudes into gap 8 between substrate 3 and semiconductor chip 1 by the capillary action. Thus, gap 18 is filled with liquid resin 6 leaving a closed cavity 10 reduced in pressure.

Figure 2D:
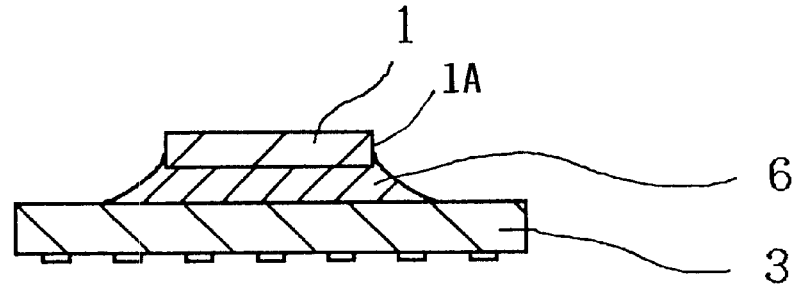

As shown in FIG. 2D, the atmosphere around substrate 3 is pressurized to a predetermined pressure, for example, to the atmospheric pressure. Accordingly, closed cavity 10 reduced in pressure in gap 8 between substrate 3 and semiconductor chip 1 is compressed by the pressure difference from the ambient air to be eliminated under atmospheric pressure. As a result, gap 8 is completely filled with resin 6. Then, a heating step is applied to cure liquid resin 6. By the foregoing steps, cured seal resin is formed at gap 8 between substrate 3 and semiconductor chip; and also at the circumference of semiconductor chip 1. Pressurization of the atmosphere around substrate 3 can be effected by using, for example, a valve provided in the exhaust path and releasing the atmosphere to the open air.

According to the resin sealing method of the present embodiment, liquid resin is applied with an exposed portion 7 provided above substrate 3 completely surrounding semiconductor chip 1. When the atmosphere around substrate 3 is to be reduced in pressure, the air present in gap 8 between semiconductor chip 1 and substrate 3 is discharged as exhaust 9 passing above exposed portion 7 completely surrounding semiconductor chip 1. By providing an exhaust path of exhaust 9 surrounding semiconductor chip 1 and having a large area of cross section of the exhaust path, exhaust 9 can be discharged in stability. Thus, generation of a resin covering can be prevented.

The modifications shown in FIGS. 3A and 3B aim for stabilizing exhaust at the lower area of each corner of semiconductor chip 1, i.e. below the four corners when viewed in plane, in discharging the air present at the gap between semiconductor chip 1 and substrate 3.

Figure 3A:
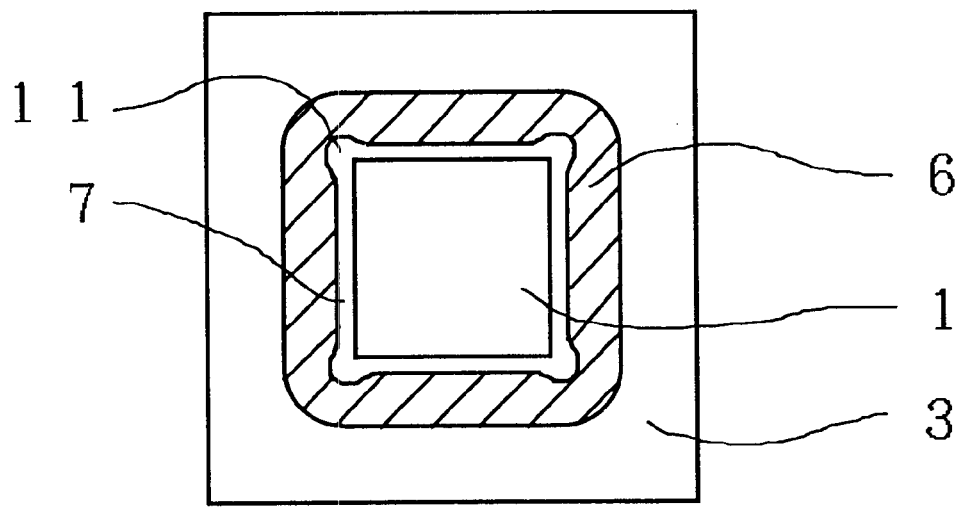
FIGS. 3A and 3B are plan views of a semiconductor device during a fabrication step employing a modification of the resin sealing method of the present invention.

According to the modification of the resin sealing method of the present invention shown in FIG. 3A, liquid resin 6 is applied completely surrounding semiconductor chip 1 with exposed portion 7 provided above substrate 3, as in the above-described embodiment. A particular region 11 is provided in the proximity of each corner of semiconductor chip 1 where the amount of resin applied is less than that of other regions.

Figure 3B:
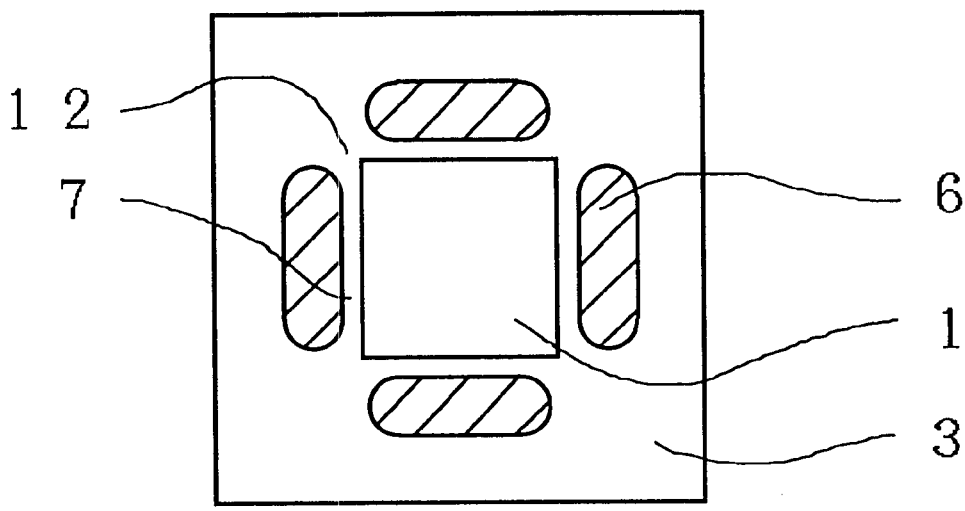

According to another modification of the resin sealing method of the present invention shown in FIG. 3B, resin 6 is applied to surround semiconductor chip 1 with exposed portion 7 above substrate 3. Furthermore, a particular region 12 absent of resin 6 is provided in the proximity of each corner of semiconductor chip 1.

According to the above two modifications, resin 6 compressed towards the closed cavity due to pressure difference from the ambient space during pressurization of the atmosphere around substrate 3 will not be concentrated at the corner of semiconductor chip 1, i.e. not blocked in flow. As a result, rise of resin 6 over the top surface of semiconductor chip 1 at the corner of semiconductor chip 1 is suppressed. The air present in the gap between semiconductor chip 1 and substrate 3 can be exhausted in stability from the entire circumference of semiconductor chip 1, as in the above embodiment. Also, the rise of resin 6 at the corner of semiconductor chip 1 can be suppressed when the atmosphere around substrate 3 is pressurized. Thus, generation of a resin covering can be reliably prevented.

Figure 4:
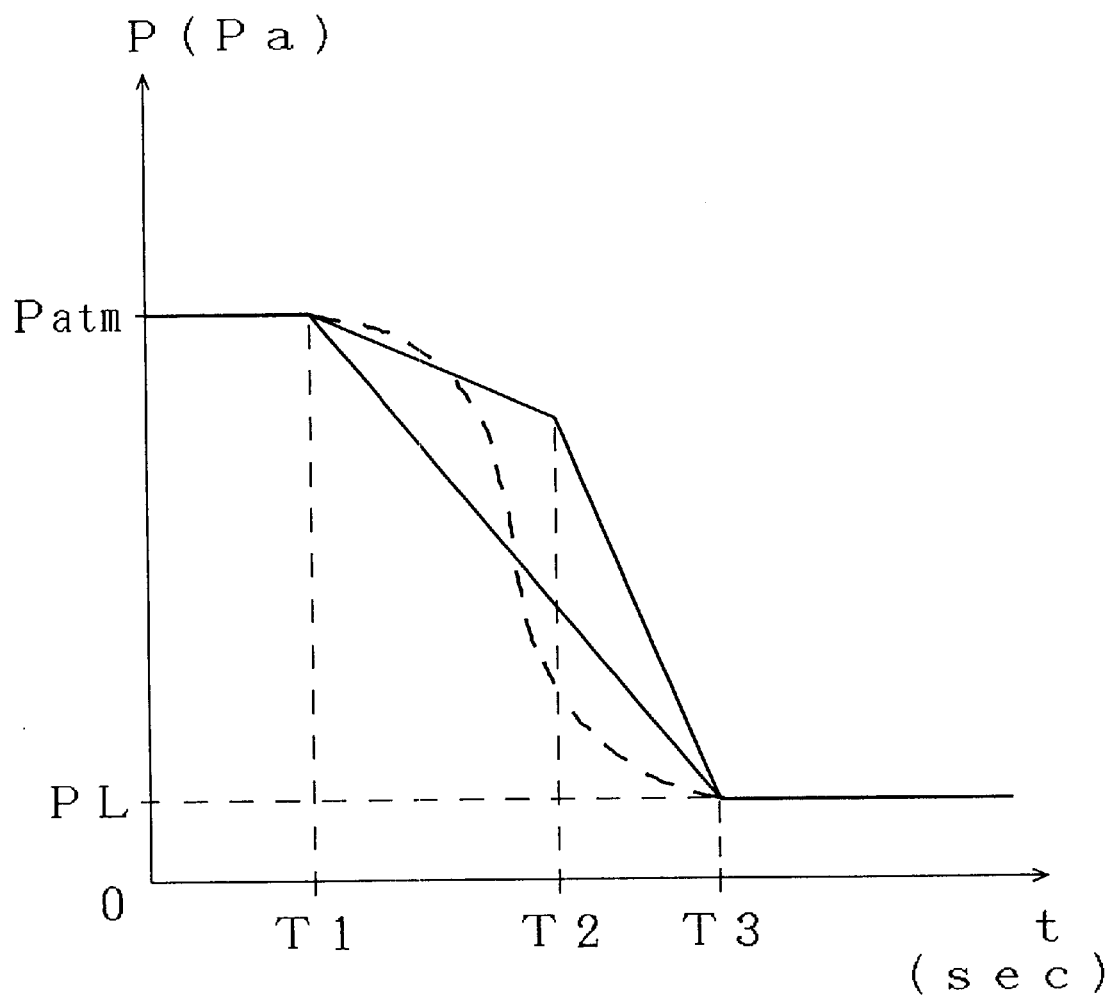
FIG. 4 is a diagram to describe the relationship between exhaust time t and air pressure P as to exhaust in the resin sealing method of the present invention.
Figure 5A:
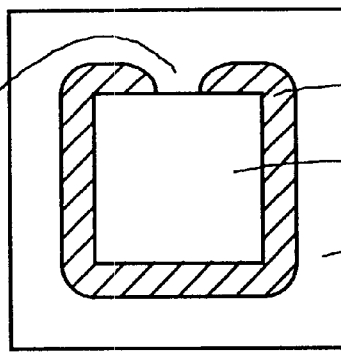
FIGS. 5A–5D are plan views of a semiconductor device at respective steps corresponding to a conventional resin sealing method.
Figure 5B:
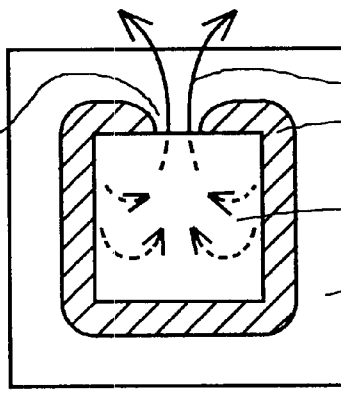
Figure 5C:
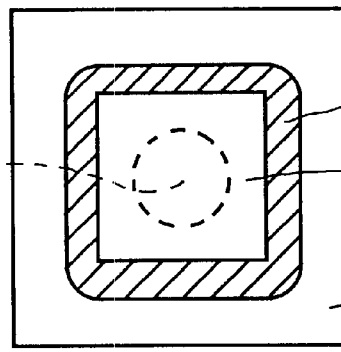
Figure 5D:
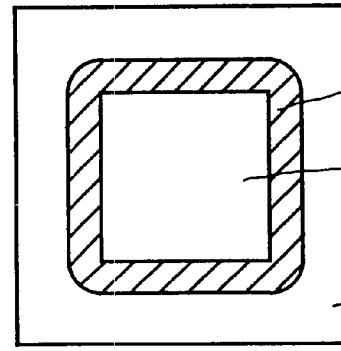
Figure 6A:
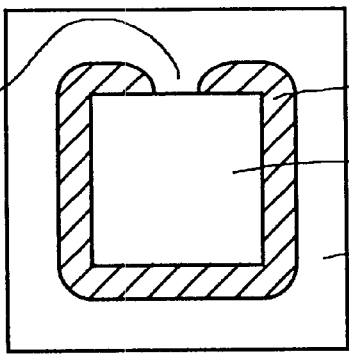
FIGS. 6A–6D are plan views of a semiconductor device at respective steps indicating problems encountered in the conventional resin sealing method.
Figure 6B:
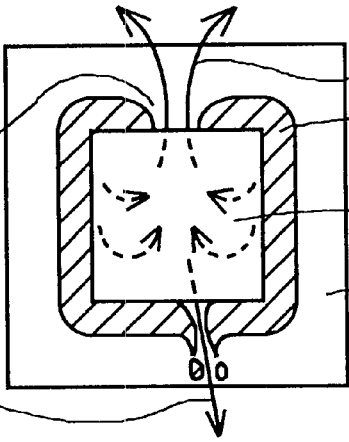
Figure 6C:
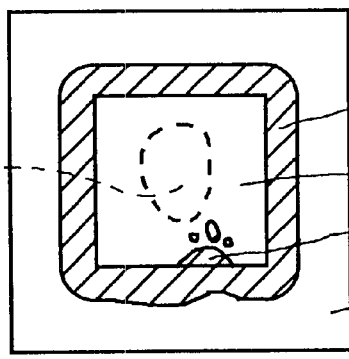
Figure 6D:
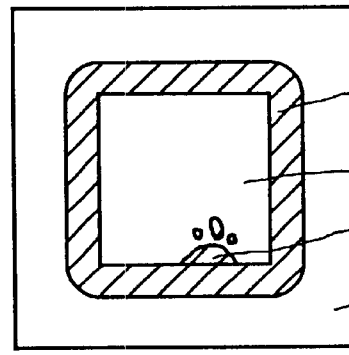

Referring to FIG. 4, Patm is the atmospheric pressure and takes the value of 900–1060 hPa whereas the achievable pressure PL is the pressure around the substrate after the pressure-reduction step. As shown in FIG. 4, the atmosphere around the substrate is gradually reduced to achievable pressure PL over a period of time in order to prevent generation of a resin covering. With achievable pressure PL set to 20 Pa, for example, the pressure is reduced from atmospheric pressure Patm down to achievable pressure PL (=20 Pa) over a period of 5 seconds starting from pressure-reduction start time T1 to pressure-reduction end time T3. In order to reliably prevent generation of a resin covering, the pressure is reduced from atmospheric pressure Patm down to achievable pressure PL (=20 Pa) over a period of 7–10 seconds, for example. The resin is then heated to have the viscosity reduced under the pressure-reduced state. Then, pressure is applied up to a predetermined pressure, for example, up to atmospheric pressure Patm.

The pressure can be reduced gradually from pressure-reduction start time T1 to a predetermined time T2, and then the pressure can be reduced rapidly from time T2 to pressure-reduction end time T3, as shown in FIG. 4. Furthermore, the pressure can be reduced continuously as shown by the broken line in FIG. 4. Since exhaust is gradually effected from the high pressure state to lower the pressure, followed by rapid exhaust, the discharge operation can be effected more stably to reliably prevent generation of a resin covering.

Resin covering can be reliably prevented by the combination of the exhaust of FIG. 4 with the application of resin shown in FIGS. 2A–3B.

Figure 7:
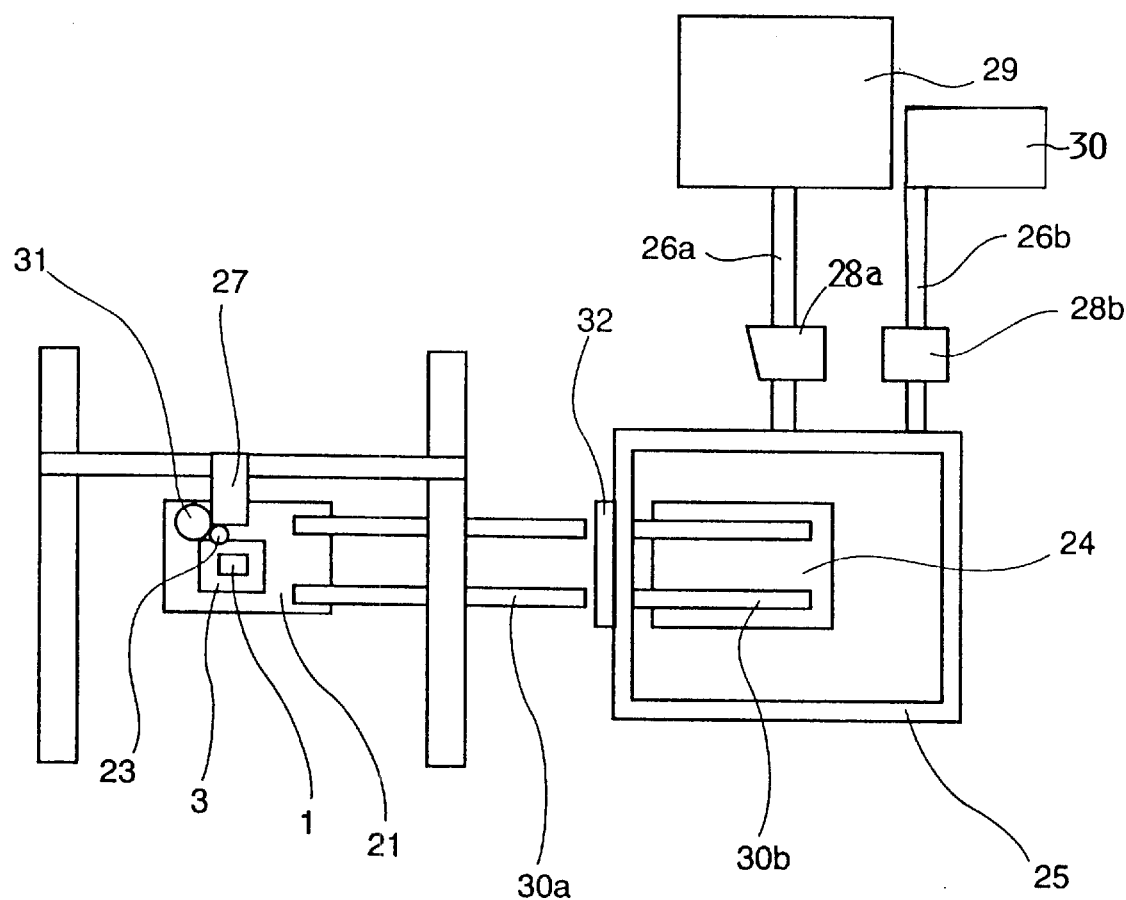
FIG. 7 schematically shows a structure of a resin sealing apparatus of the present invention.

The resin sealing apparatus of the present invention will be described with reference to FIG. 7. The resin sealing apparatus includes a stage on which is arranged a carrying body such as a tray 21 which carries thereon the substrate 3 with the semiconductor chip 1 attached thereon, a syringe (not shown) storing liquid resin, a dispenser nozzle 23 to emit resin by air pressure or the like, a heating stage 24 for heating the substrate 3, a mechanism (not shown) for moving the tray 21 for supplying the substrate 3 having the resin applied thereon, to the heating stage 24 and taking out the substrate 3 from the heating stage 24, a hermetic vessel 25 to seal up the substrate 3 supplied to the heating stage 24, tubes 26a, 26b adapted for pressuring or reducing pressure from the interior of hermetic vessel 25, flow rate adjust valves 28a, 28b provided respectively in the passage of tubes 26a, 26b, and a vacuum pump 29 functioning through tube 26a.

One end of tube 26b is opened to the atmosphere and the inner pressure of hermetic vessel 25 is returned to the atmospheric pressure by opening flow rate adjust valve 28b. Dispenser nozzle 23 is mounted to a XYZ robot 27 together with a camera 31 for image recognition used for adjusting the positional relation between the tip of the dispenser nozzle 23 and the substrate 3. Vacuum pump 29 reduces the pressure of the interior of the hermetic vessel 25. Compressor 30 is optionally connected to the tube 26b for pressurizing the interior of hermetic vessel 25.

Using this resin sealing apparatus, resin is emitted from the dispenser nozzle 23 at an appropriate timing while moving the dispenser nozzle 23 by means of the XYZ robot 27. Accordingly, liquid resin is applied on the substrate 3 as shown in FIGS. 2A–3B. After a shutter 32 attached to hermetic vessel 25 is opened, the carrying body 21 with the substrate 3 having the resin applied thereto being carried thereon, is introduced into hermetic vessel 25 along guide rails 30a, 30b through the mechanism for supplying substrate 3. Then, shutter 32 is closed and exhaust shown in FIG. 4 is effected by means of the flow rate adjust valve 28a and the vacuum pump 29. The resin is heated by the heating stage 24 through the substrate 3, whereby the viscosity of the resin is reduced.

The interior of hermetic vessel 25 is pressurized to a predetermined pressure, for example the atmospheric pressure, by means of flow rate adjust valve 28b. Then, resin is further heated by heating stage 24 to be cured. By the foregoing operation, the semiconductor device shown in FIG. 1 can be fabricated using the resin sealing apparatus of the present invention.

The resin sealing apparatus of the present invention is not limited to the above-described structure. The usage of flow rate adjust valve 28a,28b and vacuum pump 29 in reducing or applying pressure is only a way of example. Also, other heating means such as an infrared lamp can be used instead of heating stage 24.

The embodiments are described in which epoxy resin is used as resin. However, thermosetting resin such as silicone resin, vinyl polymerization resin, phenol resin, unsaturated polyester resin, diallyl phthalate resin, or super engineering plastic such as PPS and aromatic polyamide, general-purpose engineering plastic such as nylon resin and ultra-high molecular weight polyethylene, or thermal plastic resin such as thermoplastic elastomer using olefin or amide can be also used.

The bump is not limited to that formed of solder, and may be formed of Au, Ag/Sn and the like, or another conductive material such as conductive resin.

Although exposed portion 7 is provided completely surrounding the circumference of semiconductor chip 1 in the above embodiments, resin can be applied to come into contact with a portion of the side face of semiconductor chip 1 as long as a resin covering is not generated. Accordingly, resin can flow smoothly downwards of semiconductor chip 1 from the region in contact with the side face of semiconductor chip 1 under the state where the viscosity of resin is reduced.

As to the predetermined pressure, pressure is reduced down to 20 Pa and pressurized up to the atmospheric pressure in the above embodiments. However, the pressure can be reduced to less than 20 Pa or higher than 20 Pa. Also, the pressure can be increased up to below the atmospheric pressure or higher than the atmospheric pressure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of resin-sealing a gap between a substrate and a semiconductor chip mounted on said substrate, comprising the steps of:

applying resin at a circumferential position of said semiconductor chip while maintaining a predetermined space between said resin and a side face of said semiconductor chip, after said step of applying said resin, then reducing a pressure of an atmosphere around said substrate to exhaust air from said gap, reducing a viscosity of said applied resin to partially fill said gap with said resin leaving a closed cavity reduced in pressure, and pressurizing the atmosphere around said substrate to compress said closed cavity due to a pressure difference between the atmosphere and said closed cavity to entirely fill said gap with said resin.

2. The method according to claim 1, wherein a smaller amount of said resin is applied adjacent to a corner of said semiconductor chip than at another site away from a corner of said semiconductor chip in said step of applying said resin.

3. The method according to claim 1, wherein said resin is applied at said circumferential position of said semiconductor chip excluding a site where a circumferential configuration of said semiconductor chip is formed as a corner in said step of applying said resin.

4. The method according to claim 1, wherein said step of reducing said pressure comprises reducing said pressure from atmospheric pressure down to a predetermined pressure over a predetermined period of time.

5. A method of resin-sealing a gap between a substrate and a semiconductor chip mounted on said substrate, comprising the steps of:

applying resin at a circumferential position of said semiconductor chip so that said resin contacts a first portion of a side face of said semiconductor chip and so as to maintain a predetermined space between said resin and a second portion of said side face, after said step of applying said resin, then reducing a pressure of an atmosphere around said substrate to exhaust air from said gap, reducing a viscosity of said applied resin to partially fill said gap with said resin leaving a closed cavity reduced in pressure, and pressurizing the atmosphere around said substrate to compress said closed cavity due to a pressure difference between the atmosphere and said closed cavity to entirely fill said gap with said resin.

6. The method according to claim 5, wherein said step of reducing said pressure comprises reducing said pressure from atmospheric pressure to a predetermined pressure over a predetermined period of time.

7. A method of resin-sealing a gap between a substrate and a semiconductor chip mounted on said substrate, said method comprising the steps:
   a) applying resin onto said substrate along at least a first portion of a perimeter of said semiconductor chip while maintaining an open space between said resin and at least a first area of said first portion of said perimeter of said semiconductor chip;
   b) after said step of applying said resin, then reducing a pressure of an atmosphere around said substrate to a reduced pressure so as to exhaust gas out from said gap through at least said open space;
   c) after said step of applying said resin, reducing a viscosity of said resin to enable said resin to flow partially into said gap, while forming a closed cavity surrounded by said resin in said gap; and
   d) increasing said pressure of said atmosphere around said substrate from said reduced pressure so as to compress said closed cavity due to a pressure difference between said atmosphere and said closed cavity.

8. The method according to claim 7, wherein said step a) further comprises applying said resin onto said substrate entirely along said perimeter of said semiconductor chip.

9. The method according to claim 7, wherein said step a) further comprises applying said resin onto said substrate only along said first portion of said perimeter and not along a second portion of said perimeter of said semiconductor chip.

10. The method according to claim 9, wherein said first portion corresponds to at least one side edge of said perimeter of said semiconductor chip, and said second portion corresponds to a corner of said perimeter of said semiconductor chip.

11. The method according to claim 7, wherein said step a) further comprises applying said resin so as to avoid all contact between said resin and said perimeter of said semiconductor chip.

12. The method according to claim 7, wherein said step a) further comprises contacting said resins onto a second area of said first portion of said perimeter of said semiconductor chip.

13. The method according to claim 7, wherein said perimeter includes plural side edges with corners respectively therebetween, said first portion is a first one of said side edges, and said step a) further comprises applying said resin onto said substrate along all of said side edges without applying said resin onto said substrate at said corners.

14. The method according to claim 7, wherein said step a) further comprises applying said resin as a bead of said resin, while varying a thickness of said bead of said resin at different locations of said perimeter.

15. The method according to claim 14, wherein said step a) further comprises relatively reducing said thickness of said bead of said resin at a corner of said perimeter and relatively increasing said thickness of said bead of said resin at a side edge of said perimeter.

* * * * *